(12) United States Patent
Kim

(10) Patent No.: US 8,547,284 B2
(45) Date of Patent: Oct. 1, 2013

(54) APPARATUS AND METHOD FOR DETECTING RADIATED POWER

(75) Inventor: Seong-Min Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 362 days.

(21) Appl. No.: 12/962,308

(22) Filed: Dec. 7, 2010

(65) Prior Publication Data

US 2011/0134000 A1  Jun. 9, 2011

(30) Foreign Application Priority Data

Dec. 7, 2009 (KR) .......................... 10-2009-0120549
Jul. 20, 2010 (KR) .......................... 10-2010-0070192

(51) Int. Cl.
*G01R 29/10* (2006.01)

(52) U.S. Cl.
USPC .......................................... 343/703; 343/753

(58) Field of Classification Search
USPC .......................................... 343/703, 753, 754
See application file for complete search history.

(56) References Cited

U.S. PATENT DOCUMENTS

| | | | | |
|---|---|---|---|---|
| 4,201,987 A | * | 5/1980 | Tricoles et al. | 343/703 |
| 7,280,077 B2 | * | 10/2007 | Woo et al. | 343/703 |
| 7,755,550 B2 | * | 7/2010 | Hess et al. | 343/703 |
| 8,228,247 B2 | * | 7/2012 | Kitada et al. | 343/703 |
| 8,330,661 B2 | * | 12/2012 | Oh et al. | 343/703 |
| 2010/0207827 A1 | | 8/2010 | Oh et al. | |

FOREIGN PATENT DOCUMENTS

| | | |
|---|---|---|
| EP | 2068159 A1 | 6/2009 |
| JP | 2001-194401 A | 7/2001 |
| JP | 2008-089567 A | 4/2008 |
| KR | 10-2009-0029978 A | 3/2009 |
| WO | WO-2007/117108 A1 | 10/2007 |

* cited by examiner

*Primary Examiner* — Tan Ho
(74) *Attorney, Agent, or Firm* — Rabin & Berdo, P.C.

(57) ABSTRACT

A radiated power detection apparatus including a reception antenna and a probe in a Fresnel zone determines a measurement parameter of a wireless communication device and coincides central points of an antenna that is included in the wireless communication device, the reception antenna, and the probe. Next, the radiated power detection apparatus measures the magnitude of an electric field corresponding to at least one measurement point while transferring the reception antenna and the probe according to a measurement parameter, calculates the magnitude of a maximum electric field in a far-field using the magnitude of an electric field, and thus detects radiated power of the wireless communication device based on the magnitude of a maximum electric field.

13 Claims, 4 Drawing Sheets

APPARATUS AND METHOD FOR DETECTING RADIATED POWER

CROSS-REFERENCE TO RELATED APPLICATION

This application claims priority to and the benefit of Korean Patent Application No. 10-2009-0120549 and 10-2010-0070192 filed in the Korean Intellectual Property Office on Dec. 7, 2009 and Jul. 20, 2010, the entire contents of which are incorporated herein by reference.

BACKGROUND OF THE INVENTION (a) Field of the Invention

The present invention relates to an apparatus and method for detecting radiated power. More particularly, the present invention relates to an apparatus and method for detecting effective isotropic radiated power of a wireless communication device.

(b) Description of the Related Art

Currently, in the ubiquitous environment, the use of wireless communication devices is quickly increasing and therefore interference between wireless communication devices is also increasing. Therefore, such interference should be efficiently managed and controlled by managing the output of wireless communication devices.

Conventionally, a method of managing the output of a wireless communication device is generally performed based on conductive power. However, it is difficult to manage a method using conductive power in an actual user environment due to mismatching of an antenna.

Therefore, in order to efficiently manage interference between wireless communication devices, output management of effective isotropic radiated power (EIRP) of a wireless communication device is essential.

However, a method of measuring EIRP of a wireless communication device that mounts a large-sized antenna such as a mobile communication base station and a broadcasting repeater has not been clearly suggested.

Conventionally, a method of measuring EIRP using a Friis transmission formula in a far-field has been used. However, a method of measuring EIRP in far-field manufacturing is restricted by a size of an antenna that is mounted in a wireless communication device. Particularly, a mobile communication base station that mounts a large-sized-antenna or a large-sized wireless communication device such as a broadcasting repeater requires a very large distance in order to form a far-field, and thus there is a problem that spatial restriction for measurement is very large.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an apparatus and method having advantages of detecting EIRP of a wireless communication device using measurement data in a Fresnel zone.

An exemplary embodiment of the present invention provides a method in which a radiated power detection apparatus including a reception antenna and a probe in a Fresnel zone detects radiated power of a wireless communication device, the method including:

determining, by the radiated power detection apparatus, a measurement parameter of the wireless communication device; coinciding central points of an antenna that is included in the wireless communication device, the reception antenna, and the probe; measuring the magnitude of an electric field corresponding to at least one measurement point while transferring the reception antenna and the probe according to the measurement parameter; calculating the magnitude of a maximum electric field in a far-field using the magnitude of an electric field; and detecting radiated power of the wireless communication device using the magnitude of a maximum electric field.

Another embodiment of the present invention provides a radiated power detection apparatus including:

a measurement unit that includes a reception antenna or a probe and that measures the signal magnitude in a Fresnel zone using the reception antenna or the probe; and a detection unit that detects EIRP of the wireless communication device based on the signal magnitude.

DETAILED DESCRIPTION OF THE EMBODIMENTS

Figure 1:
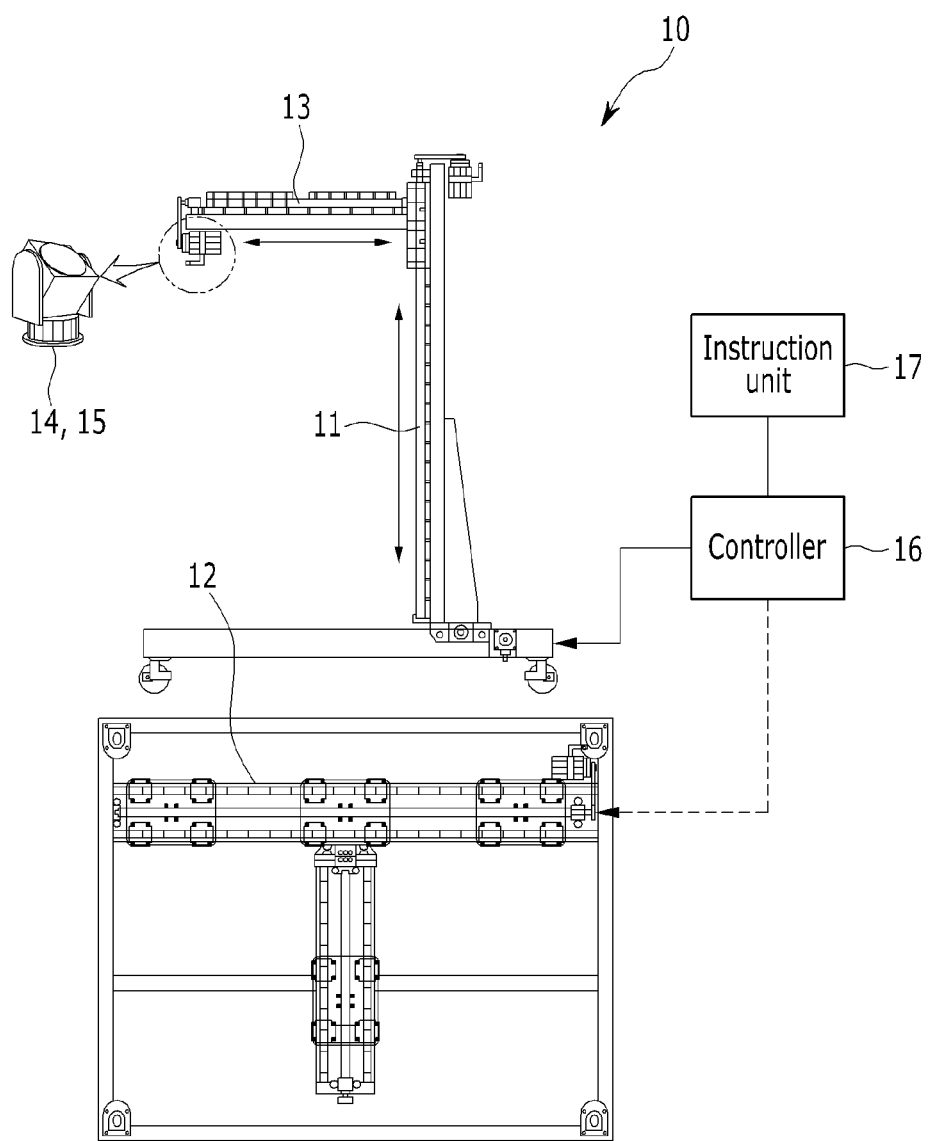
FIG. 1 is a diagram illustrating a Fresnel zone signal measurement apparatus according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In addition, in the entire specification, unless explicitly described to the contrary, the word "comprise" and variations such as "comprises" or "comprising" will be understood to imply the inclusion of stated elements but not the exclusion of any other elements.

Hereinafter, an apparatus and method for detecting radiated power according to an exemplary embodiment of the present invention will be described in detail with reference to the drawings.

First, radiated power according to an exemplary embodiment of the present invention corresponds to effective isotropic radiated power (hereinafter referred to as "EIRP") of a wireless communication device. Here, EIRP is multiplication of power of a transmitter that is supplied to an antenna and an absolute gain of an isotropic antenna.

FIG. 1 is a diagram illustrating a Fresnel zone signal measurement apparatus according to an exemplary embodiment of the present invention.

As shown in FIG. 1, a Fresnel zone signal measurement apparatus 10 mounts a reception antenna or a probe, and includes a vertical transfer unit 11, a lateral transfer unit 12, a front-rear transfer unit 13, a three surface angle converter 14, a pointer 15, a controller 16, and an instruction unit 17.

The vertical transfer unit 11 measures a signal of a vertical direction of a wireless communication device by adjusting the height of the reception antenna or the probe.

The lateral transfer unit 12 measures a signal of a lateral direction of the wireless communication device by transferring the reception antenna and the probe in a lateral direction.

The front-rear transfer unit 13 measures a signal of a front-rear direction of the wireless communication device by transferring the reception antenna and the probe in a front-rear direction.

The three surface angle converter 14 adjusts an angle of the reception antenna and the probe.

The pointer 15 coincides central points of the reception antenna or the probe and a central point of an antenna that is used in a wireless communication device to measure.

The controller 16 controls operation of the vertical transfer unit 11, the lateral transfer unit 12, the front-rear transfer unit 13, the three surface angle converter 14, and the pointer 15, thereby allowing a trajectory of the reception antenna and the probe to move along a spherical surface.

The instruction unit 17 automatically calculates an instruction for allowing a trajectory of the reception antenna and the probe to move along a spherical surface and transfers the instruction to the controller 16.

Next, a structure of the radiated power detection apparatus including the Fresnel zone signal measurement apparatus 10 will be described in detail with reference to FIG. 2.

Figure 2:
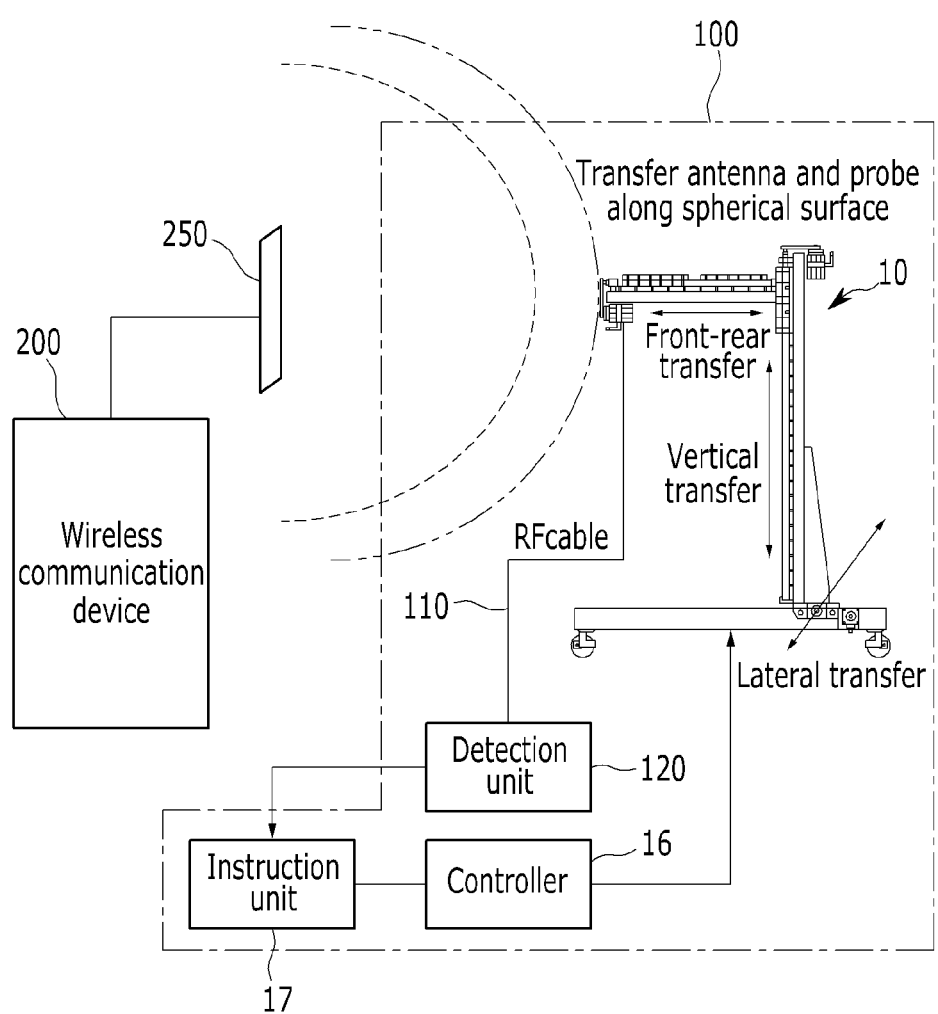
FIG. 2 is a diagram illustrating a radiated power detection apparatus according to an exemplary embodiment of the present invention.

FIG. 2 is a diagram illustrating a radiated power detection apparatus according to an exemplary embodiment of the present invention.

As shown in FIG. 2, a radiated power detection apparatus 100 includes the Fresnel zone signal measurement apparatus 10, an RF cable 110, and a detection unit 120.

The Fresnel zone signal measurement apparatus 10 includes the same elements as those of the Fresnel zone signal measurement apparatus 10 that is shown in FIG. 1, and therefore a detailed description thereof will be omitted.

The RF cable 110 transfers a received signal that is measured from a reception antenna and a probe within the Fresnel zone signal measurement apparatus 10 to the detection unit 120.

The detection unit 120 detects the magnitude of a received signal, i.e., EIRP, that is transferred through the RF cable 110.

Next, a method in which the radiated power detection apparatus 100 detects EIRP of a wireless communication device will be described in detail with reference to FIGS. 3 and 4.

Figure 3:
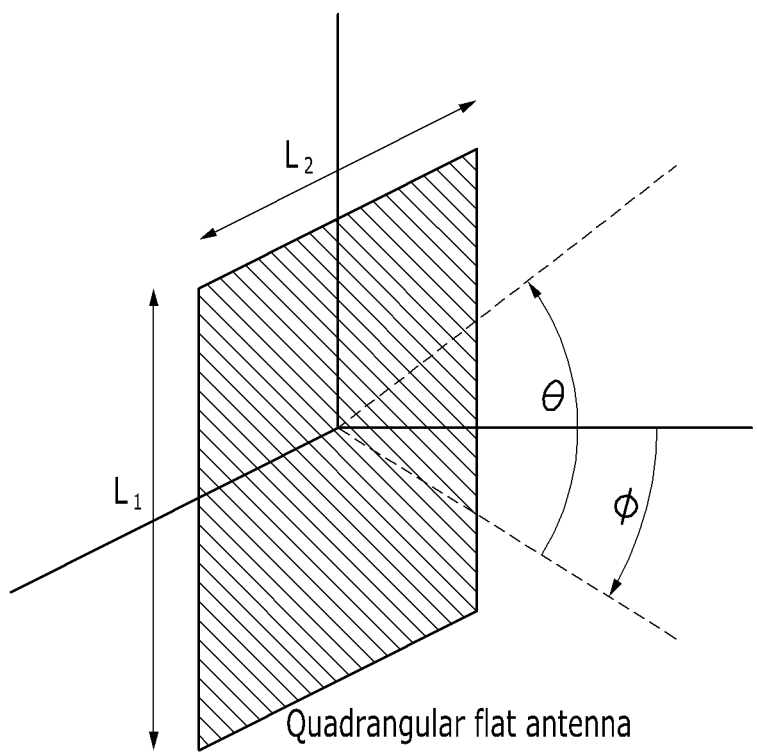
FIG. 3 is a diagram illustrating an antenna of a wireless communication device according to an exemplary embodiment of the present invention.

FIG. 3 is a diagram illustrating an antenna of a wireless communication device according to an exemplary embodiment of the present invention. FIG. 4 is a flowchart illustrating a method of detecting radiated power according to an exemplary embodiment of the present invention.

As shown in FIG. 3, an antenna 250 of the wireless communication device is a quadrangular flat antenna, but is not limited thereto. Here, L1 and L2 indicate the length and width of the quadrangular flat antenna, and θ and i indicate angles in a vertical direction and a horizontal direction, respectively, from a central point of an antenna.

Figure 4:
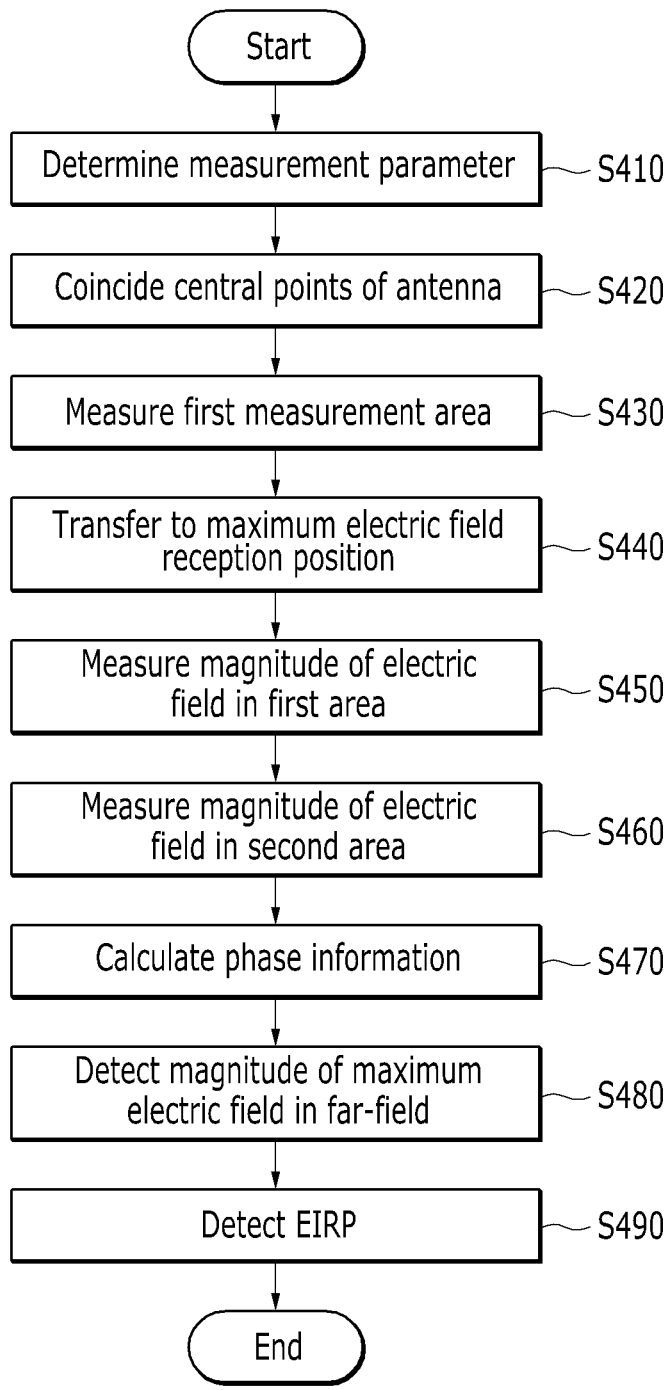
FIG. 4 is a flowchart illustrating a method of detecting radiated power according to an exemplary embodiment of the present invention.

As shown in FIG. 4, the radiated power detection apparatus 100 determines a measurement parameter corresponding to signal characteristics, use frequency, and the size of the antenna 250 of a wireless communication device 200 (S410). Here, the measurement parameter includes the quantity of measurement points and a spatial measurement gap that should be measured in order to calculate a first measurement area of a Fresnel zone signal measurement apparatus and the magnitude of an electric field of a far-field.

Specifically, the radiated power detection apparatus 100 obtains an electric field $E_{far}$ in a far-field using a constant $Coff_{km}$ and a plurality of electric fields $E_{fres}$ that transfer along a spherical surface and are measured in a Fresnel zone. Here, an electric field in a far-field is represented by Equation 1.

$$E_{far}(\theta, \phi) = \sum_{k=-K}^{+K} \sum_{m=-M}^{+M} [Coff_{km} \cdot E_{fres}(\theta + k\Delta_\theta, \phi + m\Delta_\phi)] \quad \text{(Equation 1)}$$

The radiated power detection apparatus 100 determines an area corresponding to a distance seven times greater than a wavelength I according to a use frequency of the wireless communication device 200 from a central point of the antenna 250 as a first measurement area.

Further, the radiated power detection apparatus 100 determines the quantity of measurement points using Equation 2.

$$Coff_{km} = \frac{1}{L_1 L_2} \int_{-L_1/2}^{L_1/2} \left[ \exp(-j \cdot c_1^2 u^2) \cdot \exp\left(-j \cdot \frac{2\pi}{L_1} \cdot ku\right) \right] du \cdot \int_{-L_2/2}^{L_2/2} \left[ \exp(-j \cdot c_2^2 v^2) \cdot \exp\left(-j \cdot \frac{2\pi}{L_2} \cdot mv\right) \right] dv \quad \text{(Equation 2)}$$

The radiated power detection apparatus 100 determines a spatial measurement gap using Equation 3.

$$\Delta_\theta = \frac{\lambda}{L_1}$$
$$\Delta_\phi = \frac{\lambda}{L_2} \quad \text{(Equation 3)}$$

Next, the radiated power detection apparatus 100 coincides central points of the antenna 250 that is included in the wireless communication device 200 and the reception antenna and the probe within the Fresnel zone signal measurement apparatus 10 (S420). The radiated power detection apparatus 100 according to an exemplary embodiment of the present invention can minimize a measurement error according to a slope of the antenna by coinciding the central points, and can accurately detect power.

The radiated power detection apparatus 100 stores magnitudes of electric fields that are measured at each measurement point while transferring a reception antenna and a probe according to a first measurement area by the quantity of measurement points in a unit of a spatial measurement gap (S430). In this case, the reception antenna and the probe move along a spherical surface in a specific distance within a Fresnel zone about the antenna 250 of the wireless communication device 200.

The radiated power detection apparatus 100 compares magnitudes of electric fields that are measured at each measuring point, and transfers the reception antenna and the probe to a point at which the magnitude of the electric field is measured as largest (S440). In this case, at a point at which the magnitude of an electric field is measured as largest in the Fresnel zone, the magnitude of an electric field in a far-field is also represented as largest.

The radiated power detection apparatus 100 stores the magnitude of an electric field that is measured at each measurement point while transferring a reception antenna and a probe according to a measurement parameter in a Fresnel zone, i.e., a first area corresponding to a transferred position (S450).

The radiated power detection apparatus 100 increases or decreases the distance between the wireless communication device 200 and the reception antenna and the probe by a wavelength of a measurement frequency, and stores the magnitude of an electric field that is measured at each measurement point while transferring the reception antenna and the probe according to a measurement parameter in a Fresnel zone, i.e., a second area corresponding to a changed position (S460).

The radiated power detection apparatus 100 calculates phase information at each point using the magnitude of an electric field that is measured in the first area and the magnitude of an electric field that is measured in the second area (S470). Here, the phase information is calculated using Equations 4 and 5.

$$\sum_{k=-K}^{+K} \sum_{m=-M}^{+M} [\text{Coff}_{km\_1} \cdot E_{fres\_1}(\theta + k\Delta_\theta, \phi + m\Delta_\phi)] = \\ \sum_{k=-K}^{+K} \sum_{m=-M}^{+M} [\text{Coff}_{km\_2} \cdot E_{fres\_2}(\theta + k\Delta_\theta, \phi + m\Delta_\phi)]$$

(Equation 4)

Here, fres_1 is the distance between the wireless communication device 200 and the reception antenna and the probe in the first area, and fres_2 is the distance between the wireless communication device 200 and the reception antenna and the probe in the second area.

$$\text{Angle}[E_{fres\_1}(\theta+k\Delta_\theta,\phi+m\Delta_\phi)] = \text{Angle}[E_{fres\_2}(\theta+k\Delta_\theta, \phi+m\Delta_\phi)]$$

(Equation 5)

The radiated power detection apparatus 100 calculates the magnitude of a maximum electric field in a far-field using the magnitude of an electric field that is measured in the first area and the magnitude of an electric field that is measured in the second area (S480). In this case, an electric field in a far-field is obtained using Equation 1.

The radiated power detection apparatus 100 obtains EIRP of the wireless communication device 200 using the magnitude of a maximum electric field (S490). Here, EIRP is represented by Equation 6.

$$|S| = \frac{1}{2} \cdot \sqrt{\frac{\varepsilon_0}{\mu_0}} \cdot |E_{far\_max}|^2$$

$$\text{EIRP} = |S| \cdot 4\pi R^2$$

(Equation 6)

Here, S represents a maximum power density per unit area in a far-field, and R is the distance between the wireless communication device 200 and the reception antenna and the probe in a far-field.

That is, a power value of uniformly transferring a maximum power density per unit area to an entire area corresponds to EIRP of the wireless communication device 200.

Thereby, a radiated power detection apparatus according to an exemplary embodiment of the present invention can detect EIRP of a wireless communication device using a value that is measured in a Fresnel zone and thus can efficiently perform output management of the wireless communication device.

According to an exemplary embodiment of the present invention, by detecting EIRP of a wireless communication device using a value that is measured in a Fresnel zone, EIRP of a large-sized wireless communication device such as a mobile communication base station and a broadcasting repeater can be easily detected.

Further, according to an exemplary embodiment of the present invention, by easily detecting EIRP of the wireless communication device, output management of the wireless communication device can be efficiently performed.

An exemplary embodiment of the present invention may not only be embodied through an apparatus and method, but may also be embodied through a program that executes a function corresponding to a configuration of the exemplary embodiment of the present invention or through a recording medium on which the program is recorded, and can be easily embodied by a person of ordinary skill in the art from the description of the foregoing exemplary embodiment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method in which a radiated power detection apparatus including a reception antenna and a probe in a Fresnel zone detects radiated power of a wireless communication device, the method comprising:
   determining, by the radiated power detection apparatus, a measurement parameter of the wireless communication device;
   coinciding central points of an antenna that is included in the wireless communication device, the reception antenna, and the probe;
   measuring the magnitude of an electric field corresponding to at least one measurement point while transferring the reception antenna and the probe according to the measurement parameter;
   calculating the magnitude of a maximum electric field in a far-field using the measured magnitude of said electric field; and
   detecting radiated power of the wireless communication device using the calculated magnitude of said maximum electric field.

2. The method of claim 1, wherein the measurement parameter comprises a first measurement area that first measures a signal in the Fresnel zone and the quantity and a measurement gap of the measurement points that should be measured in order to calculate magnitude of an electric field of a far-field.

3. The method of claim 2, wherein the measuring of magnitude of an electric field comprises:
   transferring the reception antenna and the probe by the quantity of measurement points in a unit of a measurement gap according to the first measurement area; and
   storing the magnitude of the electric field that is measured at each measurement point.

4. The method of claim 2, wherein the calculating of the magnitude of a maximum electric field comprises transferring the reception antenna and the probe to a point in which the magnitude of the electric field is measured as largest.

5. The method of claim 4, wherein the calculating of the magnitude of a maximum electric field further comprises:
   measuring the magnitude of an electric field corresponding to each measurement point while transferring the reception antenna and the probe according to the measurement parameter in a first area corresponding to a transferred position;

measuring the magnitude of an electric field corresponding to each measurement point while transferring the reception antenna and the probe according to the measurement parameter in a second area corresponding to a transferred position by increasing or decreasing a distance between the wireless communication device and the reception antenna and the probe by a wavelength of a measurement frequency; and calculating the magnitude of a maximum electric field in a far-field using the magnitude of an electric field that is measured in the first area and the magnitude of an electric field that is measured in the second area.

6. The method of claim 2, wherein the determining of a measurement parameter comprises determining an area corresponding to a specific distance of a wavelength according to a use frequency of the wireless communication device from a central point of an antenna that is included in the wireless communication device as the first measurement area.

7. The method of claim 1, wherein the radiated power corresponds to effective isotropic radiated power (EIRP).

8. A radiated power detection apparatus, comprising:
a measurement unit comprising a reception antenna or a probe, and that measures the signal magnitude in a Fresnel zone using the reception antenna or the probe; and
a detection unit that detects EIRP of a wireless communication device based on the signal magnitude.

9. The apparatus of claim 8, wherein the measurement unit comprises:
a transfer unit that measures the signal magnitude of the wireless communication device by transferring the reception antenna and the probe;
an angle converter that adjusts an angle of the reception antenna and the probe; and
a pointer that coincides central points of the reception antenna and the probe and an antenna that is included in the wireless communication device.

10. The apparatus of claim 8, wherein the detection unit measures the magnitude of the electric field corresponding to at least one measurement point while transferring the reception antenna and the probe according to a measurement parameter and detects radiated power of the wireless communication device using the measured magnitude.

11. The apparatus of claim 10, wherein the measurement parameter comprises a first measurement area that first measures a signal in the Fresnel zone and the quantity and a measurement gap of measurement points that should be measured in order to calculate the magnitude of an electric field of a far-field.

12. The apparatus of claim 10, wherein the magnitude of the measured maximum electric field in the far-field is calculated using the magnitude of the electric field, and the EIRP of the wireless communication device is detected using the calculated magnitude of the measured maximum electric field.

13. The apparatus of claim 12, wherein the magnitude of the maximum electric field in the far-field is calculated by:
measuring the magnitude of an electric field corresponding to each measurement point while transferring the reception antenna and the probe according to the measurement parameter in a first area corresponding to a transferred position according to the measurement parameter;

measuring the magnitude of an electric field corresponding to each measurement point while transferring the reception antenna and the probe according to the measurement parameter in a second area corresponding to a transferred position by increasing or decreasing a distance between the wireless communication device and the reception antenna and the probe by a distance of a measurement frequency; and using the magnitudes of an electric field that are measured in the first and second areas to calculate said maximum electric field.

* * * * *